United States Patent [19]

Breneman et al.

[11] Patent Number: 5,194,810

[45] Date of Patent: Mar. 16, 1993

[54] SUPERCONDUCTING MRI MAGNET WITH MAGNETIC FLUX FIELD HOMOGENEITY CONTROL

[75] Inventors: Bruce C. Breneman; Raymond E. Sarwinski, both of San Diego; Yen-Hwa L. Hsu, Solana Beach, all of Calif.

[73] Assignee: Applied Superconetics, Inc., San Diego, Calif.

[21] Appl. No.: 813,981

[22] Filed: Dec. 26, 1991

Related U.S. Application Data

[63] Continuation-in-part of Ser. No. 555,269, Jul. 18, 1990, Pat. No. 5,134,374, which is a continuation of Ser. No. 360,028, Jun. 1, 1989, Pat. No. 4,943,774.

[51] Int. Cl.$^5$ .......................... G01V 3/00; H01F 7/00
[52] U.S. Cl. ..................... 324/319; 335/216; 335/296
[58] Field of Search ............... 324/319, 318, 320, 307; 335/216, 296, 297, 298, 302, 304, 306

[56] References Cited

U.S. PATENT DOCUMENTS

| | | | |
|---|---|---|---|
| 2,777,099 | 1/1957 | Foss | 317/158 |
| 3,018,422 | 1/1962 | Seaton | 317/201 |
| 3,223,897 | 12/1965 | Sullivan | 317/158 |
| 3,417,356 | 12/1968 | Tschopp | 335/298 |
| 3,924,211 | 12/1975 | Ioffe et al. | 335/284 |
| 4,093,912 | 6/1978 | Double et al. | 335/298 |
| 4,122,386 | 10/1978 | Tomita et al. | 324/319 |
| 4,445,102 | 4/1984 | Thorn et al. | 335/297 |
| 4,498,048 | 2/1985 | Lee et al. | 324/307 |
| 4,595,899 | 6/1986 | Smith et al. | 335/216 |
| 4,656,449 | 4/1987 | Mallard et al. | 335/297 |
| 4,672,346 | 6/1987 | Miyamoto et al. | 335/296 |
| 4,980,641 | 12/1990 | Breneman et al. | 324/318 |
| 5,003,276 | 3/1991 | Sarwinski et al. | 335/304 |
| 5,095,271 | 3/1992 | Ohkawa | 324/307 |
| 5,134,374 | 7/1992 | Breneman et al. | 324/319 |

FOREIGN PATENT DOCUMENTS 0165743 7/1988 Japan .................... 324/320

Primary Examiner—Louis Arana
Attorney, Agent, or Firm—Nydegger & Associates

[57] ABSTRACT

An open access superconducting MRI magnet includes a ferromagnetic frame open on at least two sides and having upper and lower end plates and at least two support posts. A superconducting coil assembly is mounted to each end plate for generating a magnetic flux field in a patient receiving area located between the end plates. A magnetic flux field shaping means is associated with each end plate. The flux field shaping means includes rose shims, inner rings mounted within the rose shims, and removable segments mounted to the rose shims. Transition plates are located between the support ports and end plates for minimizing flux leakage. In addition the end plates are formed with a varying thickness such that a cross section taken perpendicular to a return path of magnetic flux is substantially constant.

22 Claims, 4 Drawing Sheets

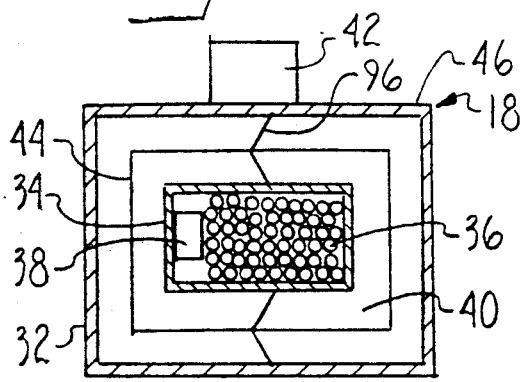
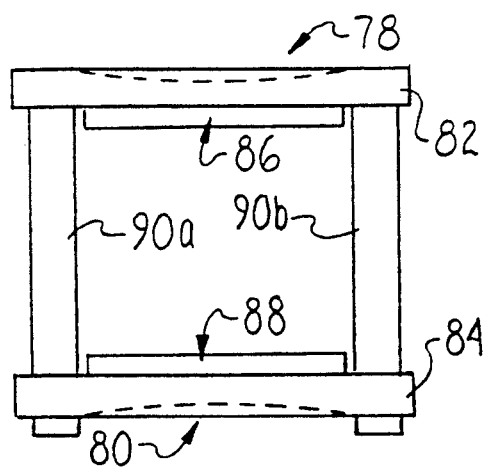
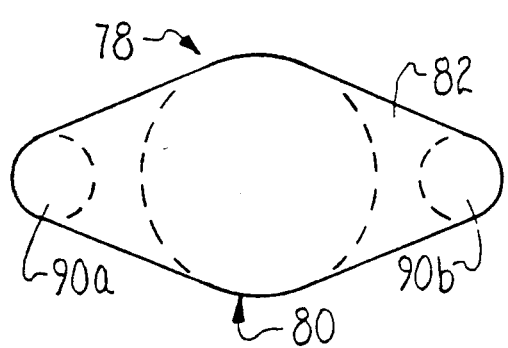
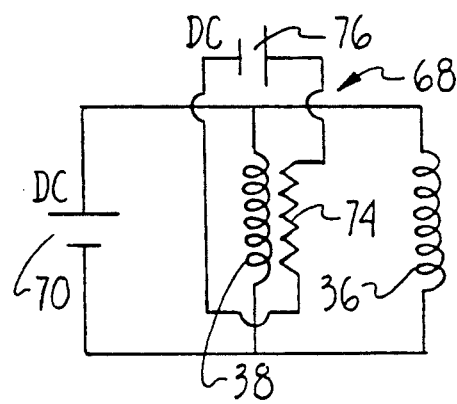
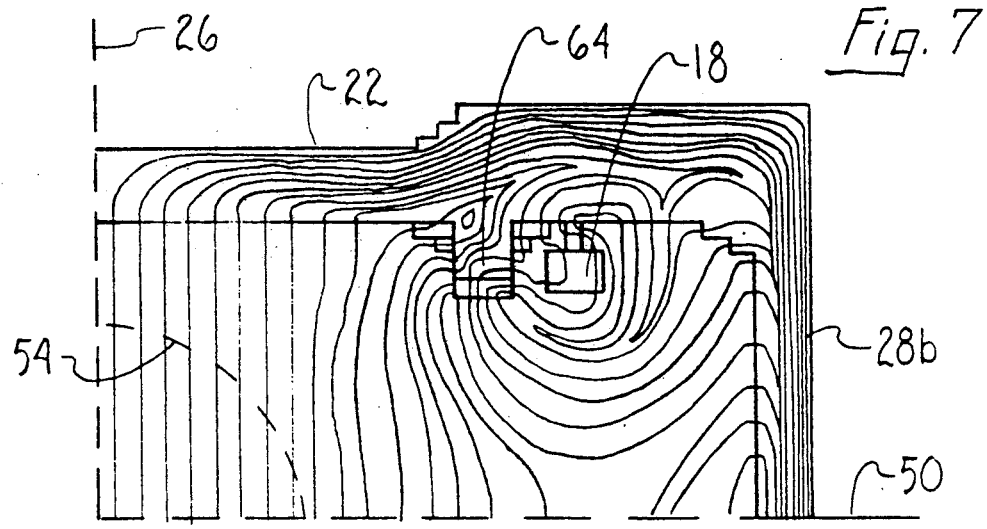

SUPERCONDUCTING MRI MAGNET WITH MAGNETIC FLUX FIELD HOMOGENEITY CONTROL

CROSS REFERENCE TO RELATED APPLICATIONS

This is a continuation-in-part of prior co-pending patent application Ser. No. 07/555,269 filed Jul. 18, 1990 now U.S. Pat. No. 5,134,374 which is a continuation of U.S. patent application Ser. No. 07/360,028 filed Jun. 1, 1989 and issued Jul. 24, 1990 as U.S. Pat. No. 4,943,774.

TECHNICAL FIELD

This invention relates to medical devices and more particularly to magnets for magnetic resonance imaging (MRI).

BACKGROUND OF THE INVENTION

In medical diagnosis, nuclear magnetic resonance (NMR) or magnetic resonance imaging (MRI) requires the production of a very strong static primary magnetic field for passage through a patient's body. A gradient magnetic field varying with time is superimposed on the primary field. Additionally, the patient is exposed to RF electromagnetic waves that are varied in time and in particular patterns. Under the influence of the magnetic and RF waves, nuclear spin distributions of atomic nuclei can be observed. This technique permits soft tissue and organs of the body to be examined for abnormalities such as tumors.

In MRI, the magnetic field must typically be a strong field on the order of about one kilogauss or more. Fields in excess of ten kilogauss (one Tesla) are sometimes required. Additionally, the field must be uniform, with non-uniformities of no more than one hundred (100) ppm. In addition, this uniformity must encompass a large portion of the patient's body, preferably with a diametral spherical volume (DSV) on the order of about 0.3 to 0.5 meters.

In the past these strong magnetic fields have been generated using permanent magnets, resistive magnets or superconducting magnets. Permanent magnets are typically the least expensive, require minimal site preparation, and are low cost to maintain due to no need for liquid cryogens. Permanent magnets however, have limited field strength, temporal instabilities, are very heavy, and costly at field strengths above 0.20 Tesla. Resistive magnets are also relatively inexpensive but require an elaborate and costly power and water supply. In addition the strength of resistive magnets is limited, large unwanted fringe fields are often generated, and temporal instabilities exist. Superconducting solenoidal magnets have the advantage of a strong field with high uniformity and good temporal stability. Superconducting solenoidal magnets, however, are expensive to construct and maintain and require elaborate cryogenic support structures. In the construction of medical MRI magnets, two different configurations or embodiments are generally in use. One type of supporting structure is known in the art as an open access structure. Such a structure typically includes opposite parallel magnetic pole faces mounted on opposite parallel support plates. At least one and usually four support columns support the support plates and provide a return path for magnetic flux. Such an open structure is favored by patients because it is open and accessible from four sides. With such a structure, the magnetic flux lines pass generally orthogonally to the longitudinal (i.e. head to toe) axis of the patient.

Another type of MRI magnet, rather than being constructed with opposite magnetic pole faces or an open access structure, is similar to a large conventional solenoid. The solenoid structure is generally cylindrical in shape and is helically wound with electrically conducting wire. An electric current conducted through the wire produces lines of flux that run through a central opening of the cylinder and generally coincident with a longitudinal axis of the patient. Such an enclosed solenoid structure is known to give some patients a claustrophobic reaction.

Different types of magnet systems have been proposed for use with each of these structures. In the past, open access structures have typically been constructed with permanent magnets attached to the opposite pole faces. U.S. Pat. No. 4,943,774 to Breneman et al. for instance, discloses such an open access MRI structure that utilizes permanent magnets. The supporting structure is fabricated of a ferromagnetic material such as high quality structural steel.

The enclosed solenoid type structures may be formed with superconducting magnets. Such superconducting magnets must be cooled to a temperature close to absolute zero ($-273°$ C.) in order for the wiring to lose resistance to the flow of electric current. Relatively small diameter wires can thus carry large currents and create high magnetic fields. The superconducting wires are typically wrapped around the outer periphery of the cylindrical structure enclosed in a cryostat vessel. Such an enclosed solenoid type structure may employ a pair of main superconducting coils and one or more auxiliary coils. Iron or other ferromagnetic materials can be mounted in the patient receiving opening, as shims for adjusting the shape of the magnetic field. These measures are required to create a uniform field having lines of flux substantially parallel to one another and extending through the patient's body.

Another type of enclosed structure is disclosed in U.S. Pat. No. 4,766,378 to Danby et al. In one embodiment of the Danby et al patent, parallel opposite pole faces are mounted on opposite parallel circular support plates. A substantially continuous support frame is located between the support plates to provide support for the pole faces and a return path for flux. An enclosed patient receiving space is located between the pole faces formed by openings through the support frame. For generating a magnetic field, superconducting wires are wound around each pole face and enclosed within a cryostatic vessel. The continuous support frame is generally circular in shape and shapes the field to create a uniform magnetic field within the enclosed patient space. This arrangement is similar to an open access MRI magnet in that the lines of flux pass generally orthogonally to the patient's body. A problem with this type of structure however, is that a patient may feel even more confined than with a solenoid type structure. Additionally the structure is large and relatively heavy and may be difficult to locate in a conventional hospital without extensive site modifications. A further disadvantage is that there is no access for additional medical personnel and equipment to perform medical techniques such as interventional radiology.

With either an open access magnet or a solenoid type magnet it is necessary to provide a uniform and homogeneous magnetic flux field in the (DSV) formed in the patient receiving area (i.e. all lines of flux need to be substantially parallel to one another). The present invention is directed to an open access MRI magnet that uses superconducting magnets to generate a uniform magnitude flux field without the use of a heavy and confining support frame. In addition, the MRI magnet includes a magnetic flux field shaping means to provide a homogeneous or uniform magnetic flux field. Accordingly it is an object of the present invention to provide an open access MRI magnet for producing a uniform magnetic flux field generated by superconducting magnets. It is another object of the invention to provide an open access MRI magnet in which a strong magnetic flux field on the order of 0.20-0.5 Tesla can be generated and shaped in a structure that is open for interventional radiology and is not confining to a patient. It is a further object of the present invention to provide an MRI magnet that can be easily adjusted by the factory to achieve a uniform homogeneous magnetic flux field.

SUMMARY OF THE INVENTION

In accordance with the present invention an open access superconducting MRI magnet with magnetic flux field control and adjustment means is provided. The MRI magnet includes one or more superconducting coil assemblies for generating a magnetic flux field, a pair of opposed spaced end plates for supporting the superconducting coil assemblies and providing a return path for the flow of magnetic flux, and support posts connecting the end plates. A patient receiving area is formed between the end plates and the superconducting coil assemblies and generates a magnetic flux field along a polar axis generally orthogonally to the end plates and to the patient. The end plates direct the magnetic flux lines generated by the superconducting coil assemblies into the patient receiving area. In this respect the end plates provide the same function as pole faces used with prior art permanent magnets.

The open access superconducting MRI magnet also includes a magnetic flux field adjustment and control means. The adjustment and control means includes a rose shim associated with each end plate and a plurality of radial segments adjustably mounted to the rose shims for shaping the magnetic flux field. One or more inner rings can also be mounted within each rose shim. The radial segments can be mounted separately on the rose shims or can be formed integrally with the rose shims as pie shaped segments. Additionally the adjustment and control means can include a transition portion at the junction of the end plates and supporting columns comprising stepped laminations. The transition portions help to channel the return flow of the magnetic flux from the supporting columns to the end plates while minimizing flux leakage. Moreover the end plates can be formed with a variable thickness such that an aggregate cross-sectional area taken in any plane perpendicular to the direction of the return flow path of the magnetic flux is substantially constant.

In a preferred embodiment, a superconducting coil assembly is associated with each end plate. A superconducting coil assembly includes cryostat means in the form of a toroidal vacuum tight cryostat vessel, insulation and one or more temperature shields mounted within the cryostat vessel, and a helium container mounted within the cryostat vessel. A coil (or coils) of superconducting wire is mounted within the helium container and is coupled to a control means including a power source and a persistent switch for generating a continuous current path through the superconducting wire.

The end plates and supporting columns provide a return path for magnetic flux generated by the superconducting coil assemblies. The magnetic flux field may be shaped by the magnetic flux field adjustment means to provide a diametral spherical volume (DSV) within the patient receiving area having a substantially uniform and strong magnetic field in the range of 0.20-0.5 Tesla with a uniformity of from 10-30 ppm. Additionally access to the patient receiving area is substantially open and the patient is accessible to multiple medical personnel and additional medical equipment. This open access frame is less restrictive to a patient and allows easier access for the practice of medical procedures such as interventional radiology.

Other objects, advantages and capabilities of the present invention will become more apparent as the description proceeds.

BRIEF DESCRIPTION OF THE DRAWINGS

FIG. 3 is an enlarged portion of FIG. 2 showing a schematic cross section through a superconducting coil in detail;

FIG. 4 is a two post open access superconducting MRI magnet constructed in accordance with the invention;

FIG. 5 is a plan view of FIG. 4;

FIG. 6 is an electrical schematic of a superconducting coil and persistent switch of an MRI magnet constructed in accordance with the invention;

FIG. 7 is a schematic view showing distribution of a magnetic flux field and a return path for the magnetic flux field;

DESCRIPTION OF PREFERRED EMBODIMENTS

Figure 1:
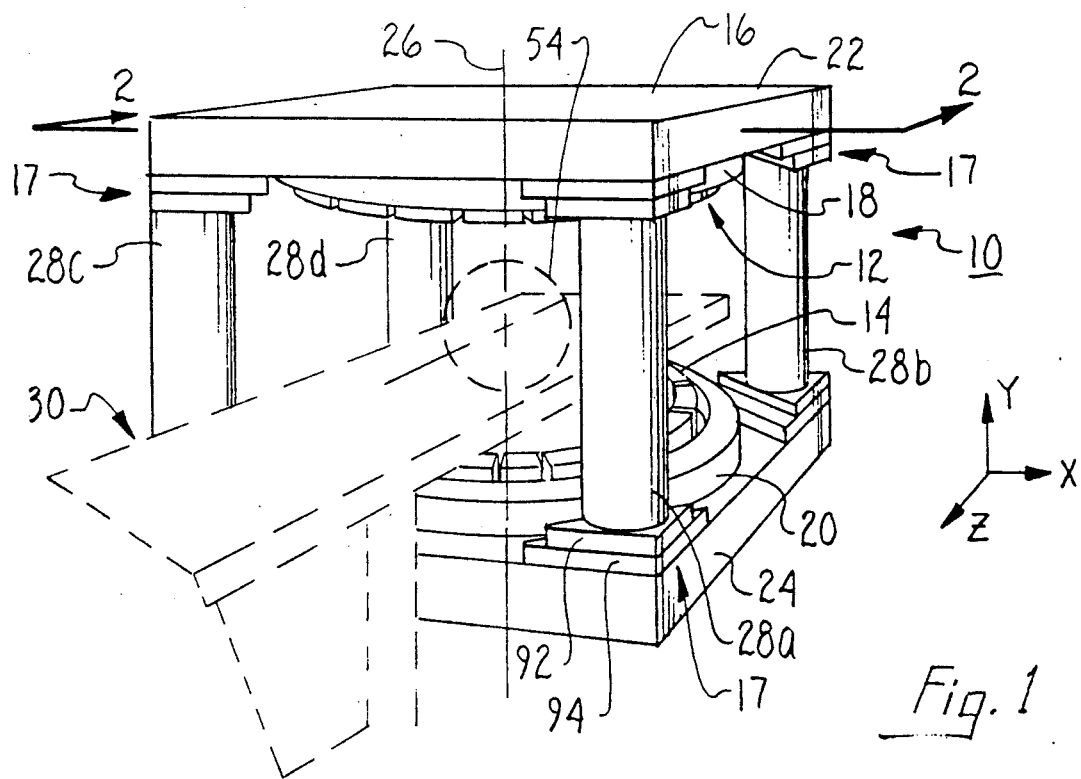
FIG. 1 is a perspective view of a four post open access superconducting MRI magnet constructed in accordance with the invention and shown with a patient support means in fathom.
Figure 2:
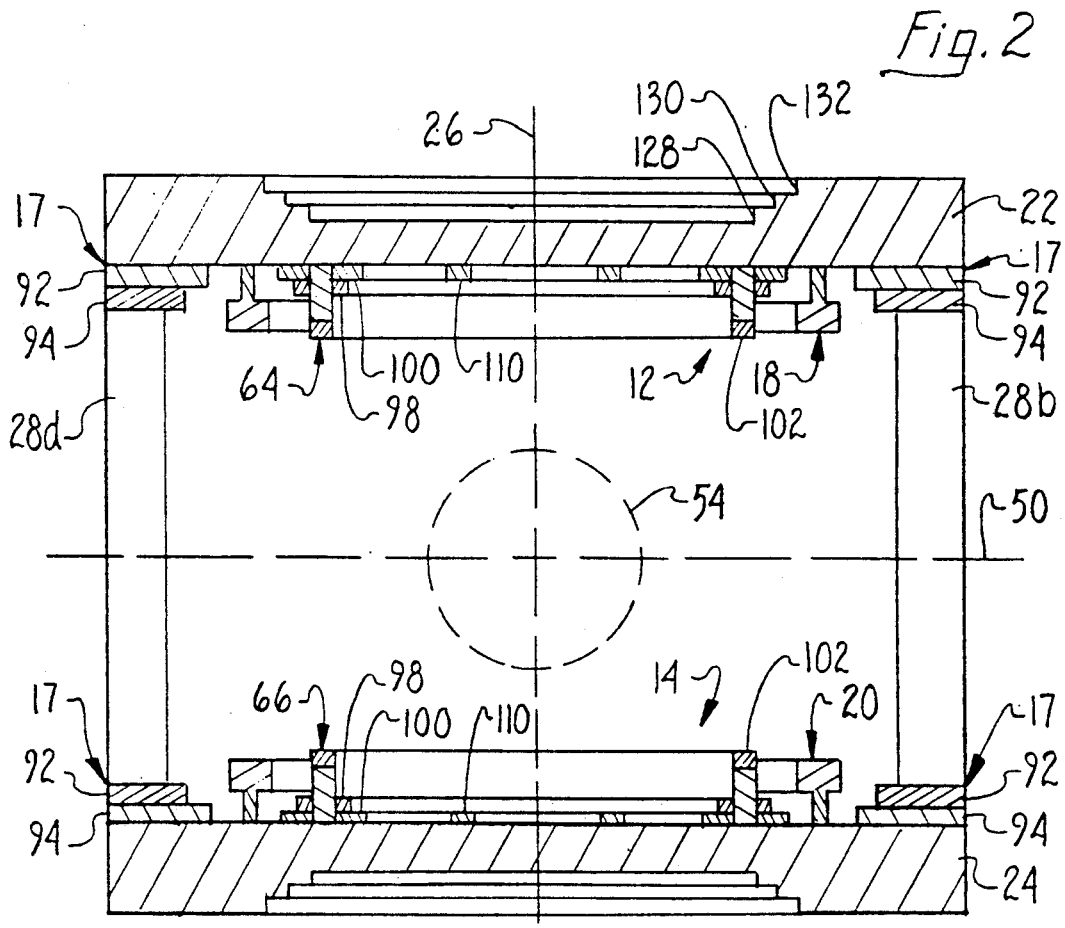
FIG. 2 is a cross-sectional schematic view taken along section line 2—2 of FIG. 1.

Referring now to FIGS. 1 and 2 an open access superconducting MRI magnet constructed in accordance with the invention is shown and generally designated as 10. The superconducting magnet 10 includes an open access frame 16 for supporting an upper superconducting coil assembly 18 and a lower superconducting coil assembly 20. In addition the MRI superconducting magnet 10 includes a magnetic flux field adjustment and control means in the form of a magnetic flux field shaping means 12, 14 associated with the upper end plate 22 and lower end plate 24 of the open access frame 16 and a transition means 17 associated with the transition between four support ports 28a-d for the upper 22 and lower 24 end plates. Generally stated the magnetic flux shaping means 12, 14, along with additional factory shimming, shapes the magnetic flux field in the DSV 54 to a range of 10-40 ppm. The transition means 17 provides a gradual transition between the support posts 28a-d and end plates 22, 24 to reduce flux leakage during operation of the MRI superconducting magnet 10.

The open access frame 16 is formed of a ferromagnetic material that can be readily magnetized (i.e. magnetically soft). A preferred material for the frame 16 is low carbon steel. The open access frame 16 includes the upper end plate 22 and lower end plate 24 for supporting the upper superconducting coil assembly 18 and lower superconducting coil assembly 20 respectively. The upper end plate 22 and lower end plate 24 may each have a generally rectangular or square outer peripheral configuration. The upper end plate 22 and lower end plate 24 are parallel to one another and generally orthogonal to a vertical polar axis 26, that passes through the middle of the open access frame 16.

The open access frame 16 also includes the four support posts 28a-d fixedly attached to the upper end plate 22 and lower end plate 24 respectively. Alternately the open access frame 16 may be formed with a lesser number of support posts (one to three). A two post frame 78 is shown in FIGS. 4 and 5. A patient receiving area 27 is located between by the upper end plate 22 and lower end plate 24 and the four support posts 28a-d. The support posts 28a-d are generally cylindrical in shape and are positioned in a generally square pattern parallel to one another. The support posts 28a-d are spaced far enough apart, from one another, to permit patient access from each of the four sides of the support frame 16. As an example, and as shown in fathom in FIG. 1, a patient support means 30 may be placed between any two support posts (i.e. 28a-c) for supporting a patient in a reclining position between the superconducting coil assemblies 18, 20. The arrangement also permits access from different sides of the patient support means 30 for additional medical equipment and personnel and for interventional radiology.

The support posts 28a-d in addition to supporting the end plates 22, 24 also provide a return path for magnetic flux generated by the superconducting coil assemblies 18,20. In order to provide a gradual transition between the four support posts 28a-d and the end plates 22, 24 transition plates 92, 94 are located at either end of the support posts 28a-d between the support posts 28a-d and end plates 22, 24. The transition plates 92, 94 are intended to provide a gradual transition between the support posts 28a-d and end plates 22, 24. This gradual transition tends to smooth the flow of magnetic flux so that there is not an abrupt angle which would allow leakage magnetic flux to escape and contribute to an unwanted fringe field. While two step transitions are shown, it can be appreciated that more than two laminations could be utilized to provide a finer step-wise transition, with the ultimate being a smooth surface. However, for ease of manufacture and cost savings, laminations are found to be convenient. The material utilized for the transition plates 92, 94 would also be the same material as the remainder of the frame, namely iron and steel. It can also be appreciated that the transition plates 92, 94 may be changed in shape from the generally triangular shape shown in order to more efficiently accommodate the return of the magnetic flux.

With reference to FIG. 3, each superconducting coil assembly 18,20 includes a toroidal, vacuum-tight cryostat vessel 32 formed from a non-magnetic material, a liquid helium container 34 mounted within the cryostat vessel 32 for connection to a source of liquid helium, and one or more coils of superconducting wire 36 mounted within the liquid helium container 34. In addition a persistent switch 38 is electrically coupled to the superconducting wire 36. With such a superconducting coil assembly 18, 20 the coils of superconducting wire 36 can be cooled to a temperature close to absolute zero, by liquid helium and at this temperature essentially have zero resistance to current flow.

The vacuum-tight cryostat vessel 32 for each superconducting coil assembly 18, 20 is generally toroidal in shape and mounted to the upper support plate 22 and lower support plate 24 respectively on mounting blocks 42 or other suitable mounting means. Each cryostat vessel 32 is adapted for one time evacuation by a suitable vacuum source such as a vacuum pump (not shown). A suitable material for the cryostat vessels 32 is aluminum or stainless steel. In addition to being vacuum tight, each cryostat vessel 32, is insulated with a suitable insulating material 40 such as super insulation (aluminized mylar) or the like. One or more metal temperature shields 44 may also be mounted within the cryostat vessel 32 as an additional heat barrier. The helium container 34 may be formed with a sealed top plate 46 that provides access to the coil leads and instrumentation located within cryostat vessel 32.

The liquid helium container 34 is also a continuous generally toroidal shaped container and is mounted on a plurality of support straps 96 or support rods mounted within the cryostat vessel 32. The temperature shield 44, as well, may be mounted on support straps 96. Such support straps 96 are shown schematically in FIG. 3 and may be similar in construction to those disclosed in U.S. Pat. No. 4,622,824 to R. L. Creedon which is incorporated herein by reference. Liquid helium container 34 has access ports for filling liquid helium and for providing lead and instrumentation penetration. The liquid helium container 34 is coupled to a suitable source of liquid helium (not shown) for cooling the interior of the helium container 34 to a temperature of about absolute zero (i.e. 4 degrees above absolute zero).

Each continuous coil of superconducting wire 36 is helically wound within the toroidal liquid helium container 34. A coil of superconducting wire 36 may be formed of any material such as a low temperature or high temperature superconductor that becomes superconducting (i.e. exhibits substantially zero resistance to current flow) below a superconducting transition temperature.

In general low temperature superconductors have a superconducting transition at a temperature close to absolute zero. High temperature superconductors have a superconducting transition at a temperature substantially above absolute zero.

As an example, copper having niobium titanium filaments within the wire is a suitable low temperature superconductor. Alternately, any material suitable for superconducting, such as materials classified as low temperature superconductors or high temperature superconductors can also be utilized in this application.

The coil of superconducting wire 36 is formed with a longitudinal axis coincident to the vertical polar axis 26. Additionally each coil of superconducting wire 36 lies in a plane generally parallel to the plane of the upper end plate 22 and lower end plate 24. In addition, each coil of superconducting wire 36 is equidistance to a medial axis 50 located exactly midway between the upper end plate 22 and lower end plate 24. The superconducting coil assemblies 18, 20 also include a persistent switch 38 that is electrically wired to the coils of superconducting wire 36. With reference to FIG. 6, each coil of superconducting wire 36 is electrically coupled to a source of DC power 70. In order to maintain a continuous flow of current in the coils of superconducting wire 36 for the upper and lower superconducting coil assemblies 18, 20, without continuous power consumption from DC power supply 70, a physically smaller non-inductive superconducting coil or persistent switch 38 is wired to the main coils of superconducting wire 36. Smaller coil of superconducting wire or persistent switch 38 is thermally in contact to a heating element 74 which has its own DC power supply 76. As is apparent to one skilled in the art, once a current flow is generated through the main coils of superconducting wire 36, the persistent switch 38 will maintain a continuous current flow with the consumption of no electrical power.

Referring back again to FIG. 2, energizing the coil of superconducting wire 36 on the upper and lower superconducting coil assemblies 18, 20 generates a magnetic flux field that emanates generally orthogonally from the plane of the upper and lower end plates 22, 24. A return path for the magnetic flux is provided by upper and lower end plates 22, 24 and by the support columns 28a–d. The magnetic flux field produced by the superconducting wires 36 is shaped to provide a substantially uniform field (i.e. 10–30 ppm) in a diametral spherical volume (DSV) 54. The DSV 54 is centered along the vertical polar axis 26 and the medial axis 50 and is preferably 0.3 to 0.5 meters in size.

For generating a magnetic flux field having lines of flux that extend through the DSV generally parallel to the vertical polar axis 26, and parallel to one another, the magnetic flux lines must be shaped. Accordingly the magnetic flux shaping means 12, 14 includes, an upper rose shim 64 and a lower rose shim 66 which are fixedly attached to the upper end plate 22 and lower end plate 24 respectively. The rose shims 64, 66 may be fabricated of a ferromagnetic material. The rose shims 64, 66 may be, (but are not limited to) a flat and cylindrical shape. As such the rose shims 64, 66 may be formed like a washer with an inner diameter and an outer diameter. The inner diameter of the rose shims 64, 66 may be sized as required to provide a magnetic flux field having desired characteristics. Additionally as shown in FIG. 2 stacked transitions plates 98, 100 may be located between either side of the rose shims 64, 66 and end plates 22, 24 for further shaping the magnetic flux field and for providing a smooth transition between the rose shims 64, 66 and the end plates 22, 24 Such transition plates 98, 100 function in substantially the same manner as transition plates 92, 94 located between the support posts 28a–d and previously described.

Figure 8:
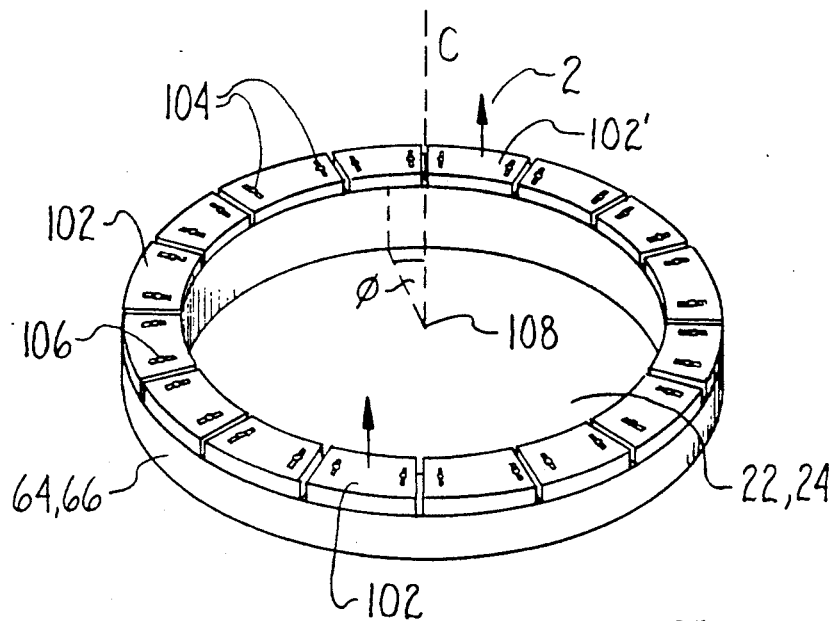
FIG. 8 is a perspective view of magnetic flux field shaping means with parts removed in an illustrative embodiment of the invention.

With reference to FIG. 8 the magnetic flux shaping means 12, 14 further includes a plurality of radial segments 102 that are removably mounted on the rose shims 64, 66. The radial segments 102 provide a means for shaping the magnetic flux field to cancel lower order perturbations which may be introduced by environmental site conditions. Although any number of radial segments 102 could be used, preferably there is an even number of radial segments 102. In the embodiment shown, there are twelve radial segments mounted on each rose shim 64, 66. The radial segments 102 are removable, and can be replaced by thinner or thicker segments. A plurality of segments may be layered to achieve a desired volume, each segment being of varying thickness as desired. Each radial segment 102 has one or more slots 104 and may be held in place, for example, by adjusting screws 106.

Different methods of adjusting the segments, also called shimming, involves (i) removing the segments, or (ii) altering the volume of the segments by replacing a segment with laminated segments that can be removed and/or added.

One method of shimming is called Tesseral shimming. Tesserals refer to the off-axis coefficients of the known Legendre polynomial which describes the x, y, z gradients of the magnetic field. The Tesseral coefficients are comprised of x, y, $x^2$-$y^2$, zxy .... In Tesseral shimming, removing a segment at a given angle $\theta$ reduces the magnetic flux density at that prescribed angle. On the other hand, adding a segment produces the converse result and increases the magnetic flux density or field at that prescribed angle $\theta$. Thus, fine tuning of these Tesseral perturbations can be done by replacing the segment with a segment composed of several laminations which can individually be adjusted to achieve the desired magnetic field density, and thus control the homogeneity of the magnetic field. Zonals refer to the on axis coefficients in the Legendre polynomial which comprise z, $z^2$, $z^3$, $z^4$, ....

Another method of shimming involves zonal shimming. In zonal shimming, segments may be added to both of opposing matched segments 102', changing the thickness of the segment in the direction shown by the arrow Z, which produces a zonal perturbation to the field which is an exponential function of the variation of the thickness of segments 102. Adding a segment to vary the thickness of only the segment 102 produces an exponential and directly proportional gradient to the magnetic field. The Z axis, again, is defined as parallel to the flux lines between the pole faces as shown by the direction of arrow Z. Thus, it can be appreciated that the present invention enables control of the magnetic field strength by making appropriate adjustments in terms of Tesseral segment adjustments as well as zonal segment adjustments to arrive at the desired field density and homogeneity.

Figure 9:
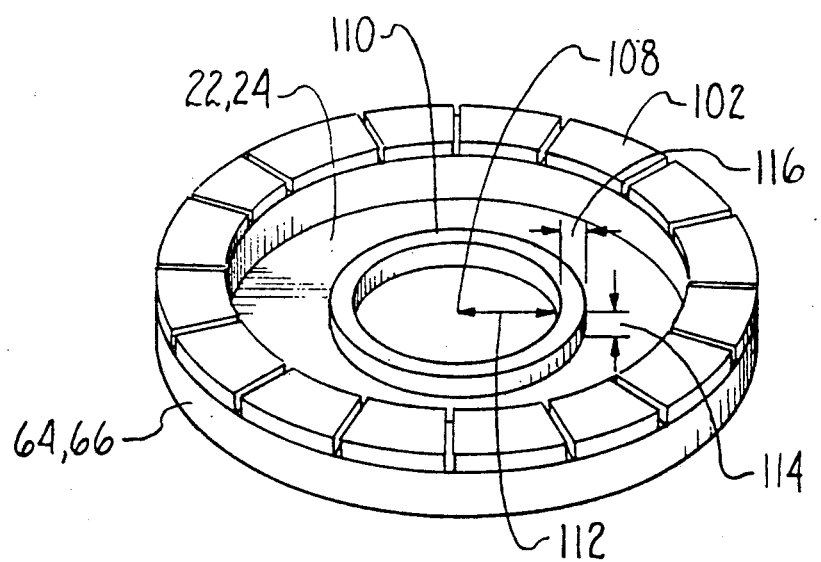
FIG. 9 is a perspective view of magnetic flux field shaping means with parts removed in another illustrative embodiment of the invention.

With reference to FIG. 9 the flux shaping means 12, 14 may further include an inner concentric ring member 110 of a specified radius 112 about the center of the rose shims 64, 66. The inner concentric ring member 110 can be made of a ferrous material such as iron. The inner concentric member 110 has a generally rectangular cross section with a height 114 and a thickness 116. By varying the radius 112, height 114, and thickness 116, various perturbations in the uniformity of the magnetic flux field can be achieved. In addition, a plurality of inner concentric ring members 110 of varying radii can be utilized, in conjunction with the removable segments 102, to achieve additional homogeneity of the magnetic flux field.

For example, placing symmetric, concentric inner rings 110 on both the upper and lower end plates 22, 24 shims out the even order axial (2) zonal perturbations to the field. In other words, symmetric placement of the inner rings 110 shims out $z^2$, $z^4$, and $z^6$ error fields. Placing a concentric inner ring 110 on only either the top or bottom end plates 22, 24 shims out the odd as well as the even order axial (z) zonal perturbations. In other words, such placement of an inner ring 110 shims out the relatively weak z, $z^3$, $z^5$ error fields in addition to the $z^2$, $z^4$ and $z^6$ error fields of the Legendre polynomial magnetic field function.

Figure 12:
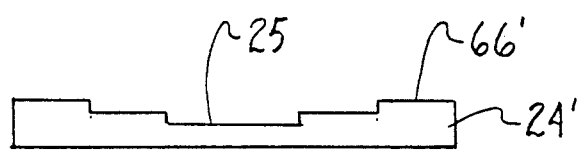
FIG. 12 is a schematic side elevation view of an alternate embodiment construction for an end plate of a MRI magnet constructed in accordance with the invention.

As shown in FIG. 12 in place of external rings 110 an end plate 24 may be contoured as shown. This contoured construction forms a stepped face 25 and functions in substantially the same manner as the external rings 110 previously described to shape the flux field between the end plates. In addition a rose shim as previously described may also be formed by the contoured surface of the end plate 24.

Figure 10:
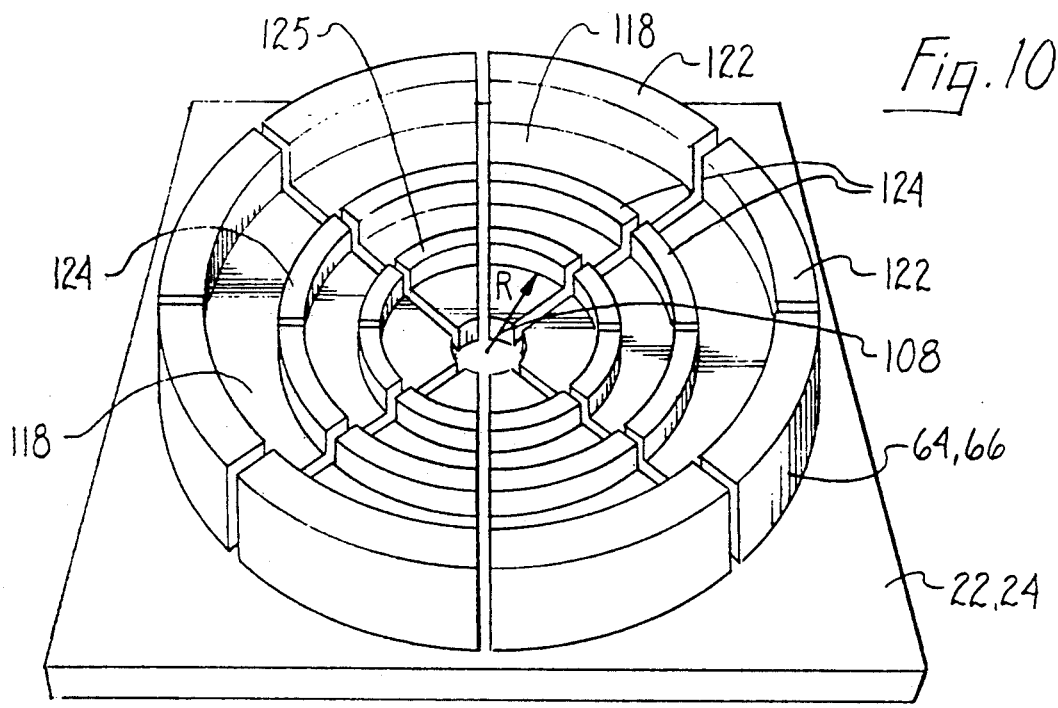
FIG. 10 is a perspective view of magnetic flux field shaping means in another illustrative embodiment of the invention.

With reference to FIG. 10, the flux shaping means 12, 14 may also be formed as a plurality of pie-shaped segments 118 separated by radial grooves 120. Each pie-shaped segment 118 includes a segment of the outer ring 122 and one or more inner rings 124 and 125. The pie shaped segments 118 are mounted upon the end plates 22, 24. As is apparent the location of the pie shaped segments 124 may be varied for adjusting the magnetic flux field in accordance with the previous discussion.

A schematic of a representative magnetic flux field generated by an MRI superconducting magnet is shown in FIG. 7. Such a magnetic flux field is characterized by parallel even spaced lines of magnetic flux in the (DSV) 54 located within the patient receiving area. The function of the magnetic flux shaping means 12, 14 including rose shims 64, 66 and segments 102 or 118 is to shape the magnetic flux lines to a uniformity of 10-40 ppm. Moreover the function of the support posts 28b and upper end plate 22 in channeling a return flow of flux is illustrated in FIG. 7.

Figure 11:
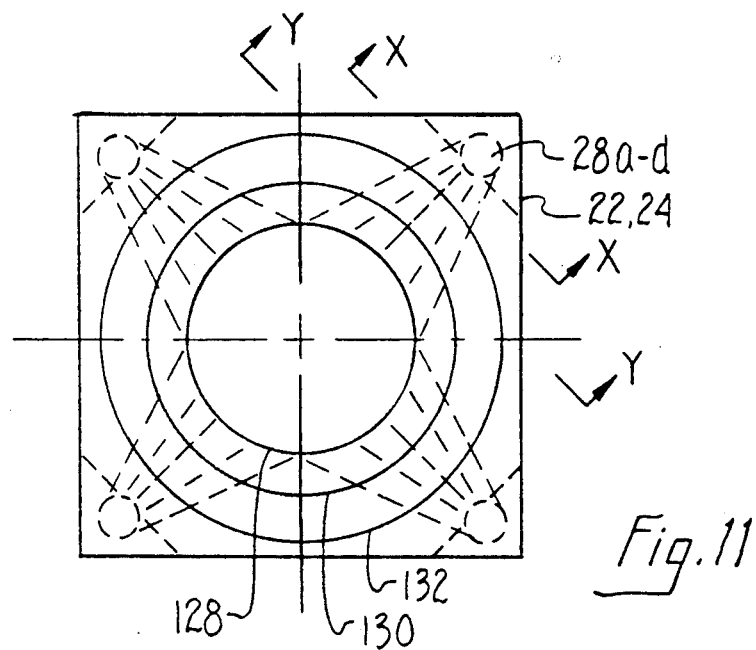
FIG. 11 is a plan view of FIG. 1.

Referring now to FIG. 11, a final feature of the adjustment and control means for providing a uniform magnetic flux field is shown and further includes shaping the end plates 22, 24 such that the cross sectional area taken in a plane perpendicular to the flow of magnetic flux remains constant for any perpendicular plane chosen. The end plates 22, 24 can thus be contoured with stepped recesses 128, 130, 132 such that the end plates have a varying cross section. The thickness of the end plates 22, 24 is therefore the least in the center and the greatest towards the outer periphery. To illustrate this concept pictorially, a section x—x in FIG. 11 taken perpendicular to the flow of magnetic flux has substantially the same aggregate cross sectional area as section y—y. This structure assists in assuring that there is minimum magnetic flux leakage to eliminate fringe, magnetic flux. At the same time, such construction allows less material to be utilized resulting in lower weight, an advantage in requiring less site preparation, less shipping and handling costs, and less production costs.

In addition, the support ports 28a-d are sized to present a combined cross-sectional area that is approximately equal to the cross sectional area through the end plates 22, 24 along any cross section perpendicular to the flow of the magnetic flux. The aggregate amount of the cross-sectional area is a function of the magnetic field strength. The stronger the magnetic flux field the more area is required to achieve minimum leakage.

OPERATION

For operation of the MRI superconducting magnet 10, liquid helium is transferred into the liquid helium containers 34 of the upper and lower superconducting coil assemblies 18, 20. Both of the coils of superconducting wire 36 are cooled and maintained by a volume of liquid helium at a temperature close to absolute zero (i.e. about 4 degrees above absolute zero). A flow of current is then generated through the coils of superconducting wires 36 by connection to the DC power supply 70. Once a current flow is initiated and stabilized, the persistent switch assembly 38 is switched on to maintain a continuous flow of current through the coils of superconducting wires 36 (each superconducting coil assembly 18, 20 may contain multiple coils of wire 36), as previously described without power consumption. With current flowing through the superconducting wires 36, a magnetic flux field is induced between the end plates 22, 24. The magnetic flux field is shaped by the flux shaping means 12, 14 such that the lines of magnetic flux are substantially parallel to one another in the (DSV) 54. For a total current of about $3.5 \times 10^5$ ampere turns, in the coils of superconducting wires 36, a magnetic flux field in the range of about 0.35 Tesla is produced. With such an MRI superconducting magnet 10 as disclosed a magnetic flux field in the range of 0.20-0.50 Tesla is preferable.

A return path for the magnetic flux field generated by the flow of current in the coils of superconducting wire 36 is provided by the open access frame 16. The return path includes magnetic flux flow through the support columns 28a-d and through the upper and lower end plates 22, 24 of the open access frame 16.

In operation the patient receiving area 27 is accessible from four sides. This allows access to the patient for additional medical equipment and personnel. Medical techniques requiring such access such as interventional radiology can therefore be practiced more easily than prior art MRI magnets that are substantially enclosed.

ALTERNATE EMBODIMENT

An alternate embodiment MRI magnet with a two post open access frame is shown in FIGS. 4 and 5, and is designated as 78. The two post MRI magnet 78 is substantially similar in construction to the four post open access MRI magnet 10 previously described but with the exception of the construction of the support frame 80. Support frame 80 includes an upper end plate 82 for upper superconducting coil assembly 86 and a lower end plate 84 for lower superconducting coil assembly 88. Patient access into the two post MRI magnet 78 is from two sides.

Thus the invention provides an open access MRI magnet utilizing opposite parallel end plates and superconducting coils for generating a strong and uniform flux field. Because the MRI magnet can be easily accessed by a patient and is open on at least two sides, a patient is less likely to experience claustrophobia during use and interventional radiology can be practiced. Moreover a control circuit for the superconducting coils includes a persistent switch for reduced power consumption. In addition, because of the open access relatively light weight structure, fewer site modification may be required during installation.

Although only certain embodiments of the invention have been described herein, it will be apparent to one skilled in the art that changes and modifications may be made thereto without departing from the spirit and scope of the invention as claimed.

What is claimed is:

1. An open access magnet for magnetic resonance imaging (MRI) comprising:
   (a) a substantially open ferromagnetic frame including an upper end plate and a lower end plate spaced apart from one another and mounted generally parallel to one another on a support column to define a patient receiving area therebetween accessible to additional medical equipment and personnel;

(b) a toroidal shaped coil of superconducting wire mounted to the frame and cryogenic means for maintaining the coil of superconducting wire at a temperature below a superconducting transition temperature for generating a magnetic flux field between the end plates along a vertical polar axis with a return path for the magnetic flux field provided by the support column and the upper and lower end plate; and (c) magnetic flux field shaping means mounted to an end plate for shaping the magnetic flux field to provide generally parallel lines of magnetic flux in a (DSV) within the patient receiving area and including:

(i) a rose shim mounted to an end plate;
(ii) a plurality of segments removably mounted to the rose shim.

2. The magnet as defined in claim 1 and wherein the magnetic flux shaping means includes:

an inner ring mounted to an end plate and within the rose shim.

3. The magnet as defined in claim 2 and wherein:
the segments and inner ring are included on a plurality of pie-shaped segments mounted to an end plate.

4. The magnet as defined in claim 1 and wherein:
a magnetic flux shaping means is mounted to each end plated.

5. The magnet as defined in claim 1 and wherein:
a thickness of the end plates is varied to provide a substantially constant cross section in any plane perpendicular to the return path of the magnetic flux field.

6. The magnet as defined in claim 1 and wherein:
a transition plate is mounted between the support column and end plates to smooth the flow of magnetic flux.

7. The magnet as defined in claim 1 and wherein:
a transition plate is mounted on either side of the rose shims to smooth the flow of magnetic flux from the end plate to the rose shim.

8. An open access MRI magnet comprising:

(a) a substantially open ferromagnetic frame including an upper end plate and a lower end plate and at least two support posts for supporting the end plates with a patient receiving area between the end plates accessible for additional medical equipment and personnel and with transition plates mounted between the end plates and support posts;

(b) a superconducting coil assembly attached to the upper and lower end plates respectively with each superconducting coil assembly including a toroidal vacuum tight cryostat vessel, insulation and one or more temperature shields mounted within the cryostat vessel, a helium container mounted within the cryostat vessel connected to a source of liquid helium, and a coil of superconducting wire mounted in the helium container for cooling the superconducting wire to a temperature below a superconducting transition temperature with the superconducting wire disposed along a coil plane generally parallel to the upper and lower end plates and formed of a material that has substantially zero resistance to electrical flow at a temperature below the superconducting transition temperature;

(c) a control means for the superconducting coil assemblies including a power source for initiating a flow of current through each superconducting coil and a persistent switch for maintaining a flow of current through the superconducting coils such that a magnetic flux field is generated along a vertical polar axis in the patient receiving area with a return path provided by the frame; and (d) magnetic flux shaping means for shaping the magnetic field to provide a substantially uniform magnetic flux field in a (DSV) located in the patient receiving area and including:

(i) rose shims mounted to the upper and lower end plates;
(ii) a plurality of segments removably mounted to the rose shims for adjusting the magnetic flux field.

9. The open access magnet as defined in claim 8 and wherein:
the upper and lower end plates are supported by four support posts such that the patient receiving area is accessible on four sides.

10. The open access magnet as defined in claim 9 and wherein:
transition plates are located between each support post and an end plate for smoothing a return flow of flux to prevent magnetic flux leakage.

11. The open access magnet as defined in claim 10 and wherein the magnetic flux shaping means includes:
inner rings mounted within the rose shims.

12. The open access magnet as defined in claim 11 and wherein:
the segments and inner rings are formed on pie shaped segments associated with each end plate.

13. The open access magnet as defined in claim 11 and wherein:
the end plates are formed with a varying thickness such that a cross section taken perpendicular to a return flow of magnetic flux is substantially constant.

14. The open access magnet as defined in claim 11 and wherein:
the support posts have a combined cross sectional area substantially equal to a cross sectional area of the end plates taken perpendicular to a return flow of magnetic flux.

15. The open access magnet as defined in claim 11 wherein:
the inner rings are formed by contouring the end plates.

16. The open access magnet as defined in claim 11 and wherein:
each segment has a slot and is adjustably and removably fastened to a rose shim with threaded fasteners placed through the slots.

17. An open access magnet for medical MRI comprising:

(a) a substantially open ferromagnetic frame including an upper end plate and a lower end plate of a varying thickness mounted on at least two support posts with the end plates spaced apart and generally parallel to one another to define a patient receiving area accessible for additional medical equipment and personnel and with transition plates mounted between the support posts and end plates;

(b) a pair of toroidal shaped superconducting coil assemblies each mounted to the support frame and associated with the upper end plate and lower end plate respectively, each mounted in a plane generally parallel to the end plates and each including a toroidal vacuum tight cryostat vessel, insulation and a temperature shield mounted within the cryostat vessel, a helium container mounted within the cryostat vessel and connected to a source of liquid helium, and a coil of superconducting wire mounted within the cryostat vessel whereby the superconducting coils may be cooled to a temperature below a superconducting transition temperature and an electric current may be passed through each coil of superconducting wire to generate a magnetic flux field with lines of magnetic flux generally parallel to a vertical polar axis and with a return path for the magnetic flux provided by the upper and lower end plates and by the support posts;

(c) magnetic flux shaping means for shaping the magnetic flux field to provide a substantially uniform magnetic flux field in a (DSV) within the patient receiving area including:
  (i) a rose shim mounted to each end plate;
  (ii) an inner ring mounted to each end plate within a rose shim; and
  (iii) a segment removably mounted to an outer periphery of the rose shims; and (d) a persistent switch connected to the coil of superconducting wire for each superconducting coil assembly to maintain a continuous current flow through the superconducting coils.

18. The open access magnet as defined in claim 17 and wherein:
  the segments and inner rings are formed on a plurality of pie-shaped segments associated with each end plate.

19. The open access magnet as defined in claim 18 and wherein:
  an aggregate cross sectional area of the support posts is approximately equal to a cross section of the end plates taken perpendicular to a direction of return flow of the magnetic flux.

20. The open access magnet as defined in claim 19 and wherein:
  circular transition plates are located on either side of the rose shims attached to the end plates.

21. The open access magnet as defined in claim 20 and wherein:
  the upper and lower end plates are generally rectangular in shape and four parallel support posts support the end plates.

22. The open access magnet as defined in claim 21 and wherein:
  transition plates are mounted between each support post and the upper and lower end plates as a flux transition means to minimize flux leakage.

* * * * *